United States Patent
Jain et al.

(10) Patent No.: US 9,236,353 B2
(45) Date of Patent: Jan. 12, 2016

(54) INTEGRATED CIRCUIT HAVING IMPROVED RADIATION IMMUNITY

(71) Applicant: Xilinx, Inc., San Jose, CA (US)

(72) Inventors: Praful Jain, Ghaziabad (IN); James Karp, Saratoga, CA (US); Michael J. Hart, Palo Alto, CA (US)

(73) Assignee: XILINX, INC., San Jose, CA (US)

( * ) Notice: Subject to any disclaimer, the term of this patent is extended or adjusted under 35 U.S.C. 154(b) by 109 days.

(21) Appl. No.: 13/686,553

(22) Filed: Nov. 27, 2012

(65) Prior Publication Data

US 2014/0145293 A1    May 29, 2014

(51) Int. Cl.
| | |
|---|---|
| H01L 27/092 | (2006.01) |
| H01L 23/552 | (2006.01) |
| H01L 21/02 | (2006.01) |
| G11C 11/412 | (2006.01) |
| H01L 27/02 | (2006.01) |
| H01L 27/11 | (2006.01) |

(52) U.S. Cl.
CPC .......... *H01L 23/552* (2013.01); *G11C 11/4125* (2013.01); *H01L 21/02697* (2013.01); *H01L 27/0207* (2013.01); *H01L 27/1104* (2013.01); *H01L 2924/0002* (2013.01)

(58) Field of Classification Search
CPC .......................... H01L 27/0207; H01L 23/552
USPC ........................................................ 257/371
See application file for complete search history.

(56) References Cited

U.S. PATENT DOCUMENTS

| | | | |
|---|---|---|---|
| 4,476,479 A | 10/1984 | Saito | |
| 5,570,313 A | 10/1996 | Masson et al. | |
| 7,515,452 B1 | 4/2009 | de Jong et al. | |
| 7,638,822 B1 * | 12/2009 | de Jong et al. | 257/206 |
| 7,795,900 B1 * | 9/2010 | Lesea et al. | 326/9 |
| 2002/0181274 A1 * | 12/2002 | Nii | 365/154 |
| 2006/0056220 A1 | 3/2006 | Roche et al. | |
| 2006/0102960 A1 * | 5/2006 | Masleid | 257/371 |
| 2007/0080406 A1 | 4/2007 | Snyder et al. | |
| 2007/0241370 A1 | 10/2007 | Terada | |
| 2007/0267760 A1 * | 11/2007 | Katsuki et al. | 257/E27.066 |
| 2009/0309144 A1 | 12/2009 | Park et al. | |
| 2010/0238715 A1 | 9/2010 | Pedersen | |
| 2010/0264953 A1 | 10/2010 | Lilja | |
| 2010/0321098 A1 | 12/2010 | Koniaris et al. | |
| 2011/0049621 A1 | 3/2011 | Lotfi et al. | |

OTHER PUBLICATIONS

U.S. Appl. No. 13/439,706, filed Apr. 4, 2012, Hart, Michael J., et al.; Xilinx, Inc., 2100 Logic Drive, San Jose, CA USA.
U.S. Appl. No. 13/439,721, filed Apr. 4, 2012, Karp, James, et al.; Xilinx, Inc., 2100 Logic Drive, San Jose, CA USA.
U.S. Appl. No. 13/587,823, filed Aug. 16, 2012, Hart, Michael J., et al.; Xilinx, Inc., 2100 Logic Drive, San Jose, CA USA.
Hsieh, C.M., et al. *A field funneling effect on the collection of alpha-particle-generated carriers in silicon devices*, IEEE Electron Device Letters, vol. 2, EDL. 2, No. 4, pp. 103-105, Apr. 1981.
Ziegler, J.F. et al., *SER-History, Trends and Challengers, a guide for designing with Memory ICs*, Cypress Semiconductor, pp. 6-3-6-5, Chapter 6, 2004, US.

* cited by examiner

*Primary Examiner* — Ajay K Arora

(74) *Attorney, Agent, or Firm* — John J. King

(57) ABSTRACT

An integrated circuit having improved radiation immunity is described. The integrated circuit comprises a substrate; a P-well formed on the substrate and having N-type transistors of a memory cell; and an N-well formed on the substrate and having P-type transistors of the memory cell; wherein the N-well has minimal dimensions for accommodating the P-type transistors.

17 Claims, 9 Drawing Sheets

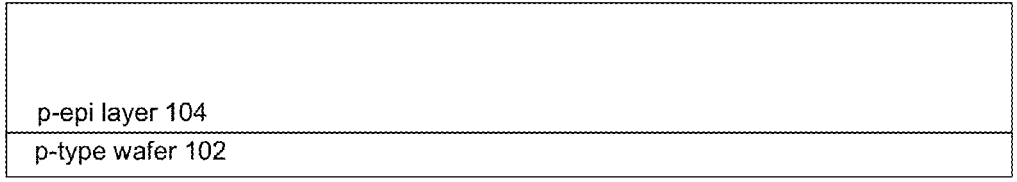
FIG. 15-A
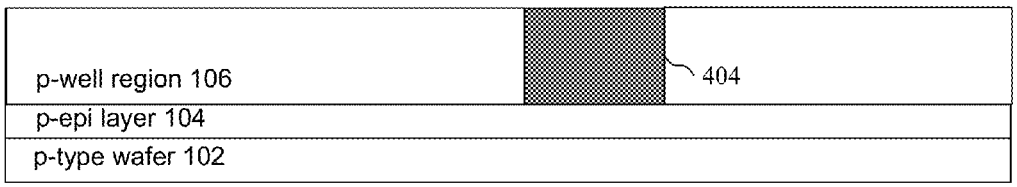
FIG. 15-B
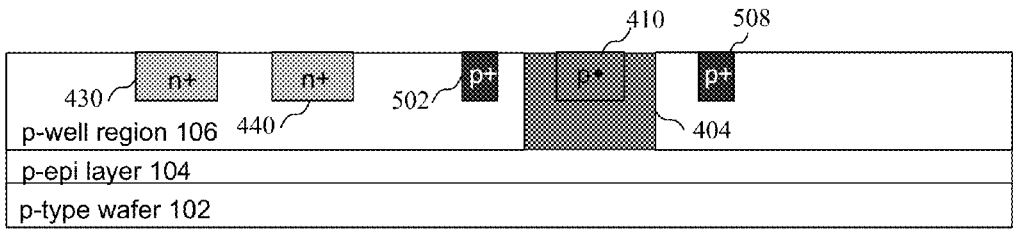
FIG. 15-C
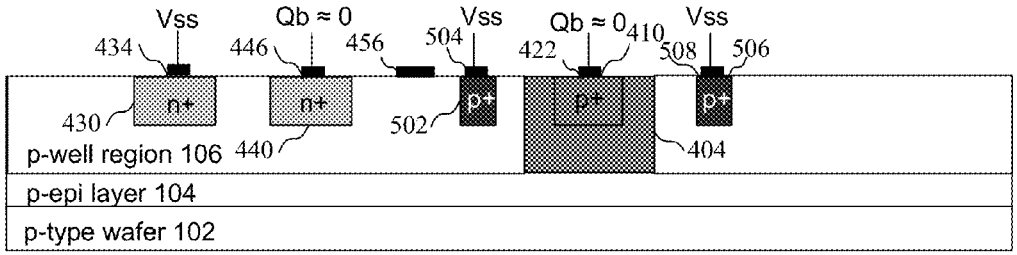
FIG. 15-D
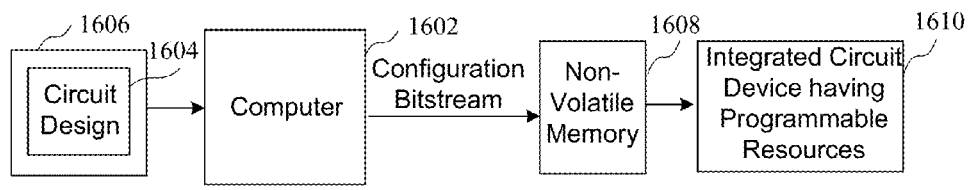
FIG. 16

INTEGRATED CIRCUIT HAVING IMPROVED RADIATION IMMUNITY

FIELD OF THE INVENTION

An embodiment relates generally to integrated circuits, and in particular, to an integrated circuit having improved radiation immunity and to a method of forming an integrated circuit.

BACKGROUND OF THE INVENTION

Integrated circuits are an important element of electronic devices. However, the operation of an integrated circuit may be affected by a radiation impact. As the dimensions of circuit elements of integrated circuits decrease, data stored in an integrated circuit may be more likely to be corrupted by radiation impacts, often called single event upset (SEU) strikes. Such radiation impacts may change or "upset" data stored in a memory element. The corrupted data may impact the performance of the integrated circuit. In some instances, the corrupted data may render the integrated circuit unusable until the correct data is restored in the memory. While techniques exist to both detect and correct data errors without having to reload the entire memory, such techniques have significant limitations.

Radiation impacts generate minority carriers which may upset the charge concentration in certain regions of the integrated circuit. Conventional techniques to sink minority carries generated during an SEU strike rely on a "buried layer" having a high recombination rate. However, experiments have shown that this layer leads to the opposite result. That is, the SEU rate increases as highly doped buried P+ layer repels minority carriers or charge, such as electrons in p-substrate. Accordingly, conventional methods of addressing the impact of an SEU strike have failed to prevent the undesirable loss of data.

SUMMARY OF THE INVENTION

An integrated circuit having improved radiation immunity is described. The integrated circuit comprises a substrate; a P-well formed on the substrate and having N-type transistors of a memory cell; and an N-well formed on the substrate and having P-type transistors of the memory cell; wherein the N-well has minimal dimensions for accommodating the P-type transistors.

According to an alternate embodiment, an integrated circuit having improved radiation immunity comprises a substrate; a P-well formed on the substrate and having N-type transistors of a memory cell having redundant nodes; and an N-well formed on the substrate and having P-type transistors of the memory cell; wherein the N-type transistors associated with a first pair of redundant nodes are separated by an N-type transistor associated with a second pair of redundant nodes.

A method of forming an integrated circuit having improved radiation immunity comprises providing a substrate; forming a P-well on the substrate, the P-well having N-type transistors of a memory cell; and forming an N-well on the substrate, the N-well having P-type transistors of a memory cell; wherein N-type transistors associated with a first pair of redundant nodes are separated by an N-type transistor associated with a second pair of redundant nodes.

BRIEF DESCRIPTION OF THE DRAWINGS

FIGS. 15-A through 15-D are a series of cross-sectional views showing the formation of a memory cell of a memory array of FIG. 6;
FIG. 16 is a block diagram of a system for programming a device having programmable resources.

DETAILED DESCRIPTION OF THE DRAWINGS

Figure 1:
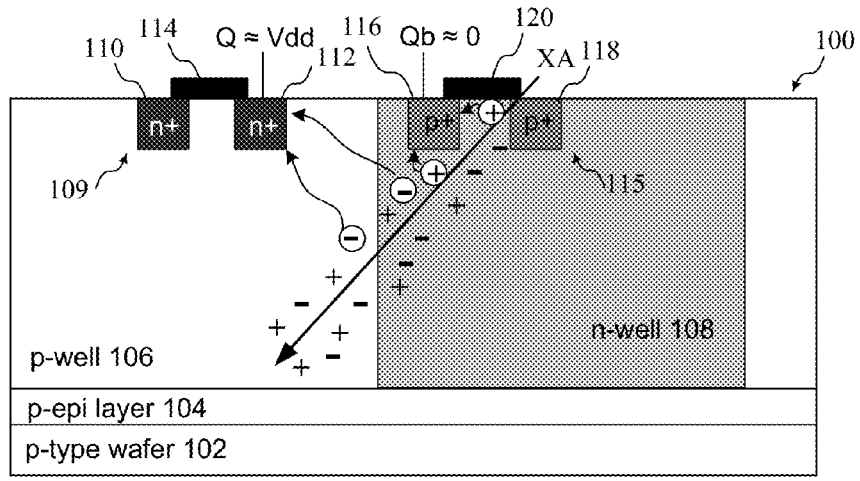
FIG. 1 is a cross-sectional view of an integrated circuit.

Turning first to FIG. 1, a cross-sectional view of an integrated circuit is shown. The integrated circuit of FIG. 1 comprises a p-type wafer 102 and a p-epitaxial (p-epi) layer 104. A p-well 106 and an n-well 108 are formed in the p-epitaxial layer 104. Transistor elements are formed in the p-well 106 and the n-well 108. In particular, a first transistor in the p-well 106 comprises a source region 110, a drain region 112 and a gate 114, as shown. A second transistor in the n-well 108 comprises a source region 116, a drain region 118 and a gate 120. The transistors of FIG. 1 are shown by way of example, and may be used in a memory cell, for example. However, as will be described in more detail below, various improvements are made to the integrated circuit to prevent undesirable minority charge from changing storage states of memory elements.

Radiation impacts on a semiconductor device may result in undesirable minority charge in regions that have a certain charge (i.e. majority charge for that region). Such radiation impacts may affect storage elements of a memory device. An undesirable change in data of a memory device is commonly called a single event upset (SEU). An SEU in a complementary metal oxide semiconductor (CMOS) static random access memory (SRAM) may be caused by two effects: the discharge of a high potential at an "n+" drain of an NMOS device (which is off) to a low potential, and charging up from a zero potential at a "p+" drain of a PMOS (which is off) to a higher potential. A rate of SEUs of an SRAM memory in proximity to an n-well is due to photovoltaic separation of charges that takes place at n-well boundaries. This separation of charges leads to an increase of potential in the p-well and a decrease of potential of the n-well. This forward biases all p-n junctions both in the n-well and p-well. As a result, nodes having a potential close to ground (i.e. logical "0" nodes) charge up and nodes having a high potential (i.e. logical "1" nodes) discharge their potential. The simultaneous changes at storage junctions of SRAM may act concurrently to flip the memory state.

Conventional approaches to addressing data upsets due to radiation strikes in terrestrial environments have focused more on soft error correction rather than soft error prevention. Soft error correction has commonly been implemented using an error correction code (ECC) and/or a cyclic redundancy check (CRC) checks. Soft error prevention has mostly been a concern only for space applications. However, soft error prevention is now becoming increasingly important for commercial purposes due to increased transistor density. As the number of memory cells in a chip rises and storage capacitance reduces with each generation of memory device, data upsets are becoming a significant concern in the semiconductor industry. Also, the latency associated with soft error correction techniques is not acceptable to many who use memory devices. Accordingly, new layouts of 6 transistor (6T) and twelve transistor (12T) SRAM cells set forth below have improved radiation immunity, while also maximizing area efficiency.

The various embodiments improve radiation immunity through the use different techniques, which can be used alone, or in combination. According to one technique, the size of an N-well having p-type transistors is minimized. Because radiation strikes in the N-well as shown for example in FIG. 1 can have the greatest impact on data stored at nodes of an SRAM cell, reducing the size of the N-well can improve the radiation immunity. The size of the N-well can be reduced by forming the elements within the N-well to the smallest possible dimensions according to manufacturing process and manufacturing constraints for the device. Further, elements which are not required to be within the region defined by the N-well can be moved outside of the N-well. For example, in a 6T cell, a power (e.g. a Vdd trace), which may otherwise be formed over the N-well, may be moved to a position over a P-well area. Moving the Vdd trace outside of the N-well region will allow for a smaller N-well area. Further, in a 12T cell, rather than providing a common word line (WL) contact for transistors on both side of the N-well, separate word line contacts for each side of the N-Well, resulting in an N-well having a reduced size and an SRAM cell having improved radiation immunity. While the use of separate word line contacts on each side of the N-well may increase the overall size of the memory cell, such an increase is made for the benefit of improved radiation immunity.

Another improvement is the use of one or more P-taps coupled to ground in P-type portions of an SRAM cell outside of the N-well. The placement of P-taps near an n-well helps prevent minority carriers from affecting nodes which are storing charge. More particularly, the placement of p-taps on one or both sides of an N-well in a memory, for example, significantly suppresses photovoltaic substrate bias and reduces upsets of data compared to conventional memory devices. The rate of upsets strongly depends on whether an ionization track crosses the n-well boundary. The use of p-taps significantly reduces the effect of minority carriers generated as a result of a radiation strike, as will be described in more detail in reference to FIG. 6.

A further improvement in 12T SRAM cells is the selective placement of transistors in the silicon of the device, as will be described in more detail in reference to FIGS. 8-11. While various examples describing the alteration of data as a result of radiation strikes, it should be understood that the various methods and circuits set forth below will help prevent the alteration of data resulting from an increase in minority carriers in a given region for any reason.

Figure 2:
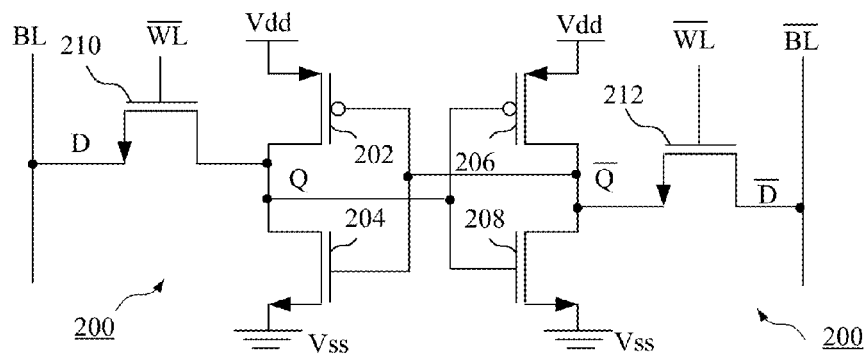
FIG. 2 is a circuit diagram of a 6 transistor memory cell.

Turning now to FIG. 2, a circuit diagram of a memory element is shown. The memory cell includes an inverter having a p-channel transistor 202 with a source coupled to a reference power voltage, such as Vdd, and a drain coupled at a first node "Q" to a drain of an n-channel transistor 204, the source of which is coupled to a ground potential (Vss). The memory cell includes a second inverter having a p-channel transistor 206 with a source coupled to the reference voltage and a drain coupled at a second node "Q_b" to a drain of an n-channel transistor 208, the source of which is also coupled to ground. The first node "Q" is controlled by an n-channel transistor 210 coupled to receive an inverted word line (WL_bar) signal at its gate which controls the receipt of input data on a bit line (BL) at the first node. The second node "Q-bar" is controlled by another n-channel transistor 212 coupled to receive the inverted word line signal at its gate which controls the receipt of inverted input data at the second node Q_b. While the memory cell of FIG. 2 is shown by way of example, other memory cells could be employed.

Figure 3:
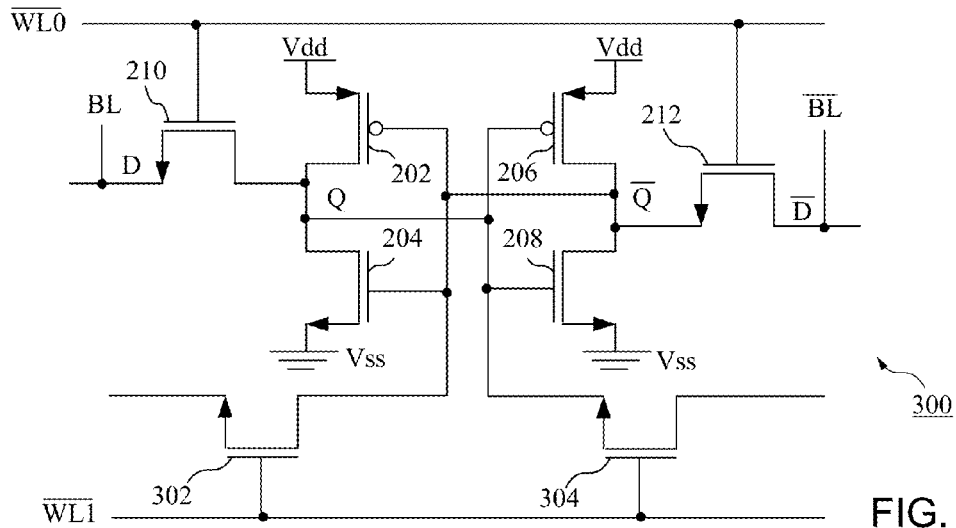
FIG. 3 is a circuit diagram of an 8 transistor memory cell.
Figure 6:
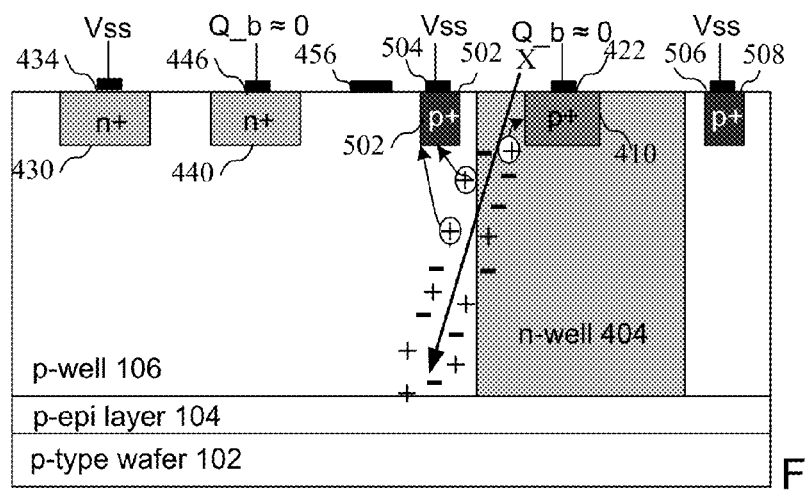
FIG. 6 is a cross-sectional view of an integrated circuit of FIG. 5.

While the embodiment of FIG. 6 represents a "6T cell," the memory element 300 of FIG. 3 represents an "8T cell." In particular, the transistors 302 and 304 are configured to enable separate inverted word lines WL0_bar and WL1_bar. The transistors 302 and 304 are configured as shown to have the source coupled to the Q and Q_b nodes as shown, where the gates are each controlled by the inverted WL1_bar. It should be understood that the various techniques described below which apply to a 6T cell would equally apply to an 8T cell.

Figure 4:
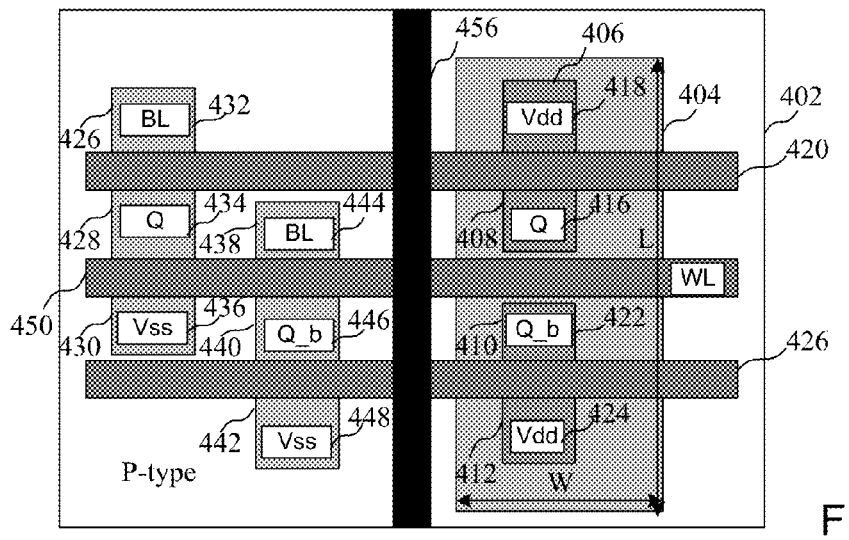
FIG. 4 is a top plan view of the circuit of FIG. 2 having an N-well of a reduced size.

Turning now to FIG. 4, a top plan view of the circuit of FIG. 2 having an N-well of a reduced size is shown. The top plan view of FIG. 4 shows an arrangement of the transistors of FIG. 2 which will reduce the likelihood of a corrupted data stored in the memory cell subjected to a radiation strike or other event which could alter the data stored in the memory cell compared to conventional circuits. As will be described in more detail below, the physical arrangement of the various elements within a semiconductor substrate and elements of the metal layers to implement the circuits shown in circuit diagram form in FIGS. 2, 3, and 7 will reduce the likelihood of data upsets due to radiation strikes. According to the arrangement of FIG. 4, a substrate portion 402 comprises the N-well 404 having p-wells 406 and 408 which are associated with the P-type transistor 202 and p-wells 410 and 412 which are associated with the P-type transistor 206. It should be noted that the regions identified as wells which form the sources and drains of transistors are also commonly called diffusion regions. Also shown in FIG. 4 is a contact 416 of transistor 202 coupled to Q node and a contact 418 of the transistor 206 coupled to the Vdd. A polysilicon contact 420 extends over a gate region of the transistor 202 between the P-wells 406 and 408. Similarly, a contact 422 of transistor 206 is coupled to Vdd and a contact 424 of the transistor 206 is coupled to the Q_b node. A polysilicon layer 426 extends over a gate region of the transistor 206 between the P-wells 410 and 412.

The remaining N-channel transistors are outside the N-well, where pairs of transistors share a common N-well. Transistors 204 and 210 are formed using N-wells 426, 428 and 430, where each transistor uses N-well 428 and the Q contact 434. A contact 432 is coupled to the bit line (BL), and a contact 436 coupled to a ground node. The polysilicon layer 420 extends over the gate region of the transistor 210 between the drain region 426 and the drain region 428. A polysilicon layer 450 extends over the gate region of the transistor 204 between the N-wells 428 and 430. Transistors 208 and 212 are formed using N-wells 438, 440 and 442, where each transistor uses N-well 440 and the Q_b contact 446. A contact 444 is coupled to the bit line, and a contact 448 coupled to a ground node. A polysilicon layer 449 extends over the gate region of the transistor 212 between the N-wells 438 and 440. The polysilicon layer 426 also extends over the gate region of the transistor 208 between the N-wells 440 and 442. Finally, a power trace 456 formed in a metal layer above a substrate having N-wells and P-wells is located in a region outside of the area covered by the N-well 404, enabling the N-well, having a length L and width W as shown, to have a smaller width W and therefore an overall smaller area. As will be described in reference to FIGS. 10 and 11, various interconnect elements which may otherwise be located over a region defined by the N-well 804 are moved outside of the region defined by the N-well. While moving various interconnect elements, such as metal traces and contact elements, outside the region defined by the N-well may increase the overall area of the memory cell, the tradeoff between size and radiation immunity can be determined based upon desired goals for size and radiation immunity.

Figure 5:
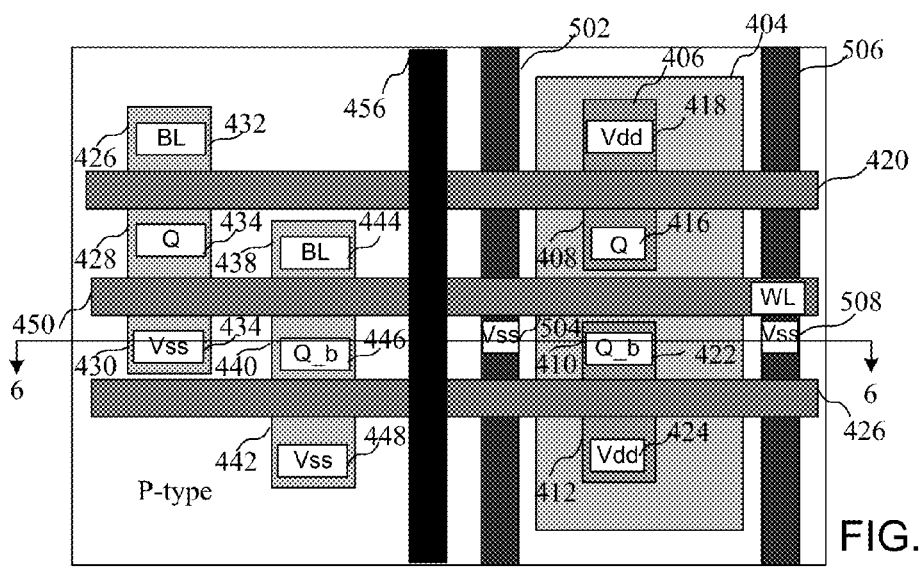
FIG. 5 is a top plan view of the circuit of FIG. 2 having an N-well of a reduced size and a P-tap.

Turning now to FIG. 5, a top plan view of the circuit of FIG. 2 having an N-well of a reduced size and a P-tap is shown. According to the embodiment of FIG. 5, a P-tap 502 having a contact 504 coupled to ground and a P-tap 506 having a contact 508 coupled to ground are implemented on either side of the N-well 404. While P-tap 502 will reduce the likelihood of both the redundant nodes will be affected by a radiation strike (as described below in reference to FIG. 6), the P-tap 506 may be employed to minimize the impact of a radiation strike on transistor of an adjacent memory cell (which could be on the other side of N-well 506).

As shown in the cross-sectional view of the integrated circuit of FIG. 2, p-taps 502 and 506 are placed on either side of the n-well. The p-taps are formed using the same process used to form the diffusion regions for the transistors. However, it should be understood that the p-taps could be deeper than the diffusion regions for the transistors. The placement of p-taps near an n-well helps prevent minority carriers from affecting nodes which are storing charge. More particularly, the placement of p-taps on both sides of n-well in a memory, for example, significantly suppresses photovoltaic substrate bias and reduces SEUs compared to conventional memory devices. Due to photovoltaic effect, the rate of SEUs strongly depends on whether an ionization track crosses the n-well boundary or not. The use of p-taps significantly reduces the effect of minority carriers generated as a result of a radiation strike.

More particularly, as shown in the cross-sectional view of FIG. 6, the P-tap 506 attract positive charge which may otherwise be attracted to the N-well 440 coupled to the Q_b node. That is, when the Q_b node stores a logical zero and is therefore at a low voltage, positive charge from the radiation strike could change the low voltage of the Q_b node. As is also shown in FIG. 6, by providing the P-tap 502, it may be possible to prevent any alteration of the data stored by the memory cell. While FIGS. 4, 5 and 6 relate to 6T, the various techniques for reducing the effects of radiation impacts could be implemented in an 8T memory cell or some other memory cell.

Figure 7:
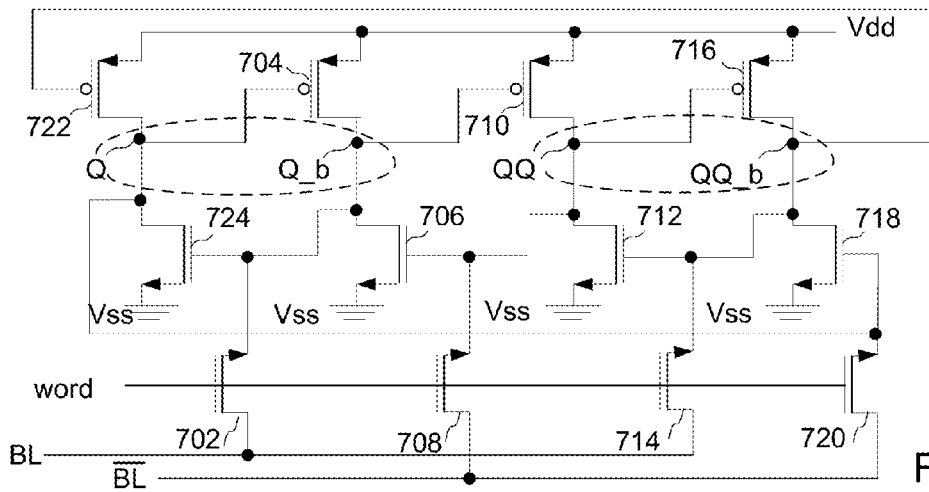
FIG. 7 is a circuit diagram of a 12T memory element.

Turning now to FIG. 7, a circuit diagram of a 12T memory element is shown. According to the embodiment shown in FIG. 7, a 12T cell comprises a plurality of CMOS transistor elements coupled between Vdd and ground. In particular, a bit line is coupled by a transistor 702 to a Q_b node at the drains of the transistors 704 and 706. An inverted bit line is coupled by a transistor 708 to a QQ node at the drains of the transistors 710 and 712. The bit line is coupled by a transistor 714 to a QQ_b node at the drains of the transistors 716 and 718. The inverted bit line is coupled by a transistor 720 to a Q node at the drains of the transistors 722 and 724. The word signal is coupled to the gates of the transistors 702, 708, 714, and 720 to generate the appropriate output data at the Q node based upon the input data. If pairs of nodes, including a first pair of nodes Q and Q_b and a second pair of nodes QQ and QQ_b shown in the dashed-line ovals, are affected by a radiation impact, the data stored in the memory cell can be flipped. That is, if transistors associated with both the Q and Q_b nodes or both the QQ and QQ_b nodes are affected, the data stored by the memory cell may be affected. As will be described in more detail below, particular pairs of transistors in both an N-well and a P-well are susceptible because of their location relative to a P-N junction.

Figure 8:
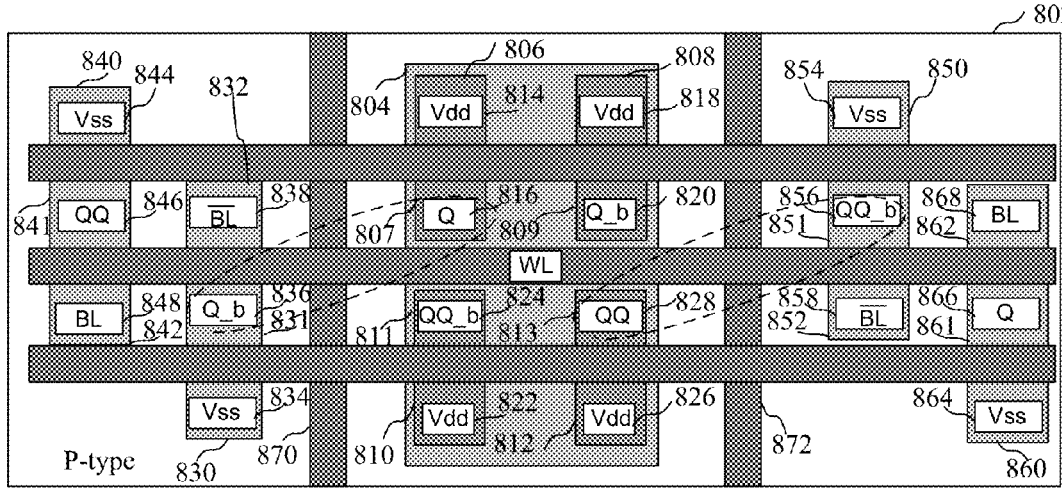
FIG. 8 is a top plan view of the circuit of FIG. 7 having a reduced size N-well.

Turning now to FIG. 8, a top plan view of the circuit of FIG. 7 having a predetermined arrangement of transistors is shown. As shown in FIG. 8, a semiconductor portion 802 of the 12T cell of FIG. 7 provides a novel arrangement of transistors to reduce upsets of data stored in the cell. The 12T cell comprises an N-well 804 having a plurality of P-Wells 806-813 for the p-channel transistors of FIG. 7. In particular, P-well 806 is associated with a contact 814 coupled to Vdd and P-well 807 is associated with a contact 816 associated with the Q node, implementing the p-channel transistor 722. P-well 808 is associated with a contact 818 coupled to Vdd and P-well 809 is associated with a contact 820 associated with the Q_b node, implementing the P-channel transistor 704. P-well 810 is associated with a contact 822 coupled to Vdd and P-well 811 is associated with a contact 824 associated with the QQ_b node, implementing the p-channel transistor 716. P-well 812 is associated with a contact 826 coupled to Vdd and P-well 813 is associated with a contact 828 associated with the QQ node, implementing the p-channel transistor 710.

The n-channel transistors are implemented in either side of the N-well. In particular, N-well regions 830, 831 and 832 enable implementing transistor 702 and 706, where a contact 834 couples the N-well 830 to ground, a contact 836 couples the Q_b node to the N-well 831, and a contact 838 couples the inverted bit line to the N-well 832. Similarly, N-well regions 840, 841 and 842 enable implementing transistor 708 and 712, where a contact 844 couples the N-well 840 to ground, a contact 846 couples the QQ node to the N-well 841, and a contact 848 couples the bit line to the N-well 842.

On the other side of the N-well region 804, N-well regions 850, 851 and 852 enable implementing transistors 714 and 718, where a contact 854 couples the N-well 850 to ground, a contact 856 couples the QQ_b node to the N-well 851, and a contact 858 couples the inverted bit line to the N-well 852. Similarly, N-well regions 860, 861 and 862 enable implementing transistor 720 and 724, where a contact 864 couples the N-well 860 to ground, a contact 866 couples the Q node to the N-well 861, and a contact 868 couples the bit line to the N-well 862. The arrangement of FIG. 8 also P-taps 870 and 872 as described above in reference to FIGS. 5 and 6.

Figure 9:
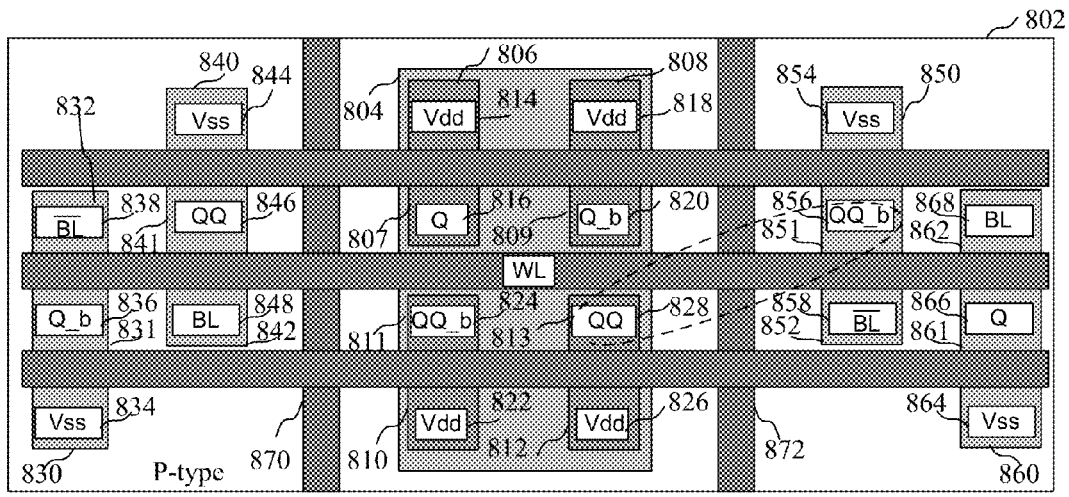
FIG. 9 is a top plan view of the circuit of FIG. 7 having a predetermined arrangement of transistors which provide improved radiation immunity.

Turning now to FIG. 9, a top plan view of the circuit of FIG. 7 having a predetermined arrangement of transistors which provide improved radiation immunity is shown. If Q_b and QQ_b NMOS diffusions (or Q and QQ NMOS diffusions) are placed adjacent to the N-well, a strike in the N-well can lead to onset of parasitic BJT effect in these NMOSs due to drifting of the excess holes from N-well to P-well. If both are in the OFF-state, this effect can cause both these nodes to flip, which leads to flipping of the data of the 12T cell. It should be noted that if any one of the transistor pairs 724-716, 706-722, 712-704, or 718-710 are struck simultaneously by the same strike, data stored in a 12T cell can be flipped.

Two of these pairs (i.e. 718-710 and 706-722 shown in the dashed lines) are present in the arrangement of FIG. 8. When the cell is in a State 0 (when Q_b and QQ_b are at approximately ground), Q_b and QQ_b are vulnerable, and have 30 times higher SER than state 1 (when Q and QQ NMOSs are vulnerable). That is, because Q_b and QQ_b NMOS diffusions of the N3-P2 and N1-P0 transistor pairs lie close to NW and the N3-P2 and N1-P0 transistor pairs are OFF, they are more vulnerable than the transistors associated with the Q and QQ nodes. In order to counter these N-well affects, the node Q_b in the P-Well is moved away from the Q node of the N-well 804 as shown in the circuit of FIG. 9. That is, the N-wells 830, 831 and 832 associated transistors 702 and 706 are switched with N-wells 840, 841 and 842 associated with transistors 708 and 712. Accordingly, the arrangement of FIG. 9 provides a novel layout of the 12T cell using ideal placement of the storage nodes Q, Q_b, QQ and QQ_b. As is apparent from FIG. 9, the Q_b and QQ_b nodes are not both adjacent to the N-well 204. That is, by moving Q_b and Q far away from one another, a radiation strike in the N-well 804 is less likely to result in switching data.

Figure 10:
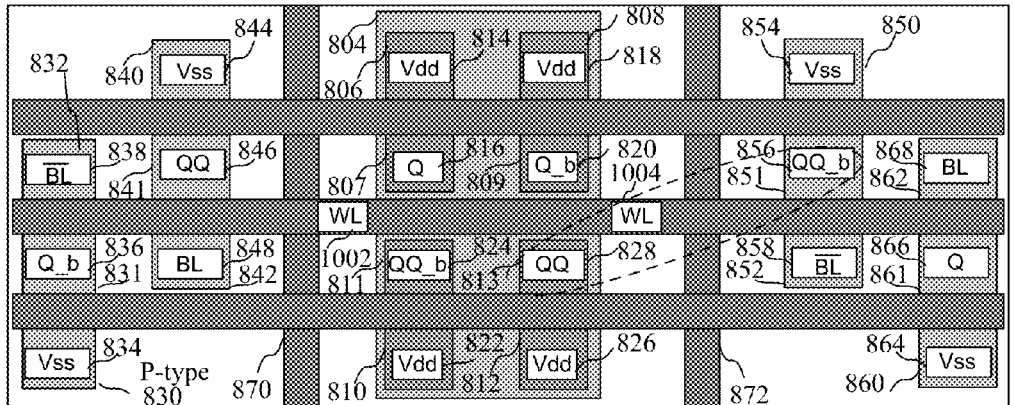
FIG. 10 is a top plan view of the circuit of FIG. 7 according to the arrangement of FIG. 9 and further having an N-well of a reduced size.

Turning now to FIG. 10, a top plan view of the circuit of FIG. 7 according to the arrangement of FIG. 8 and further having an N-well of a reduced size is shown. Rather than having a single word line as shown in FIG. 8, separate word lines 1002 and 1004 for transistors on opposite sides of the N-well 804 are provided. By replacing the single word line which is within the area defined by the N-well 804, the use of separate word lines 1002 and 1004 for transistors on opposite sides of the N-well enables an N-well having a reduced width and overall smaller area.

Figure 11:
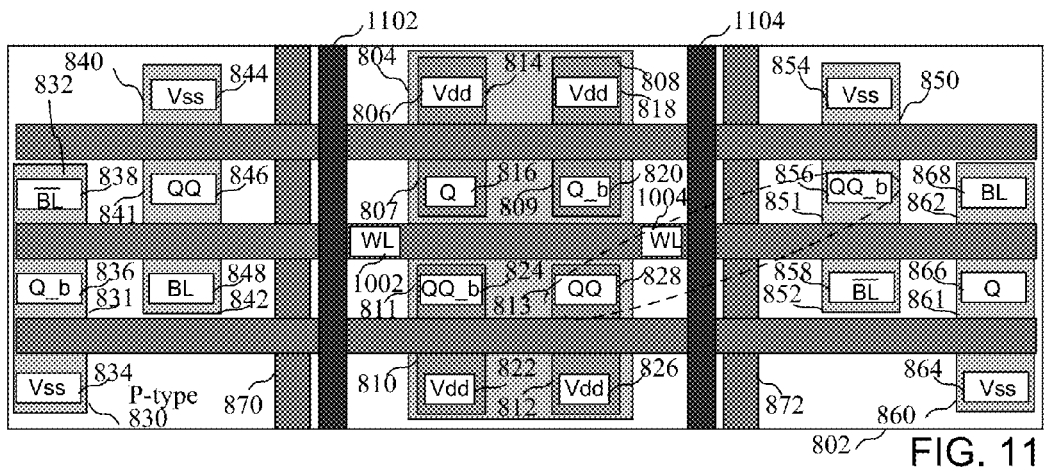
FIG. 11 is a top plan view of the circuit of FIG. 7 according to the arrangement of FIG. 10 and having a further reduced size of an N-well.

Turning now to FIG. 11, a top plan view of the circuit of FIG. 7 according to the arrangement of FIG. 10 and further having power lines 1102 and 1104 is shown. Accordingly, the embodiment of FIG. 11 provides a further reduced size N-well by placing the power lines 1002 and 1104 outside the area defined by the N-well. The embodiment of FIG. 11 also provides P-taps to prevent positive charge from affecting the Q_b and QQ_b nodes in state 0 when the transistors are off, as set forth above.

Figure 12:
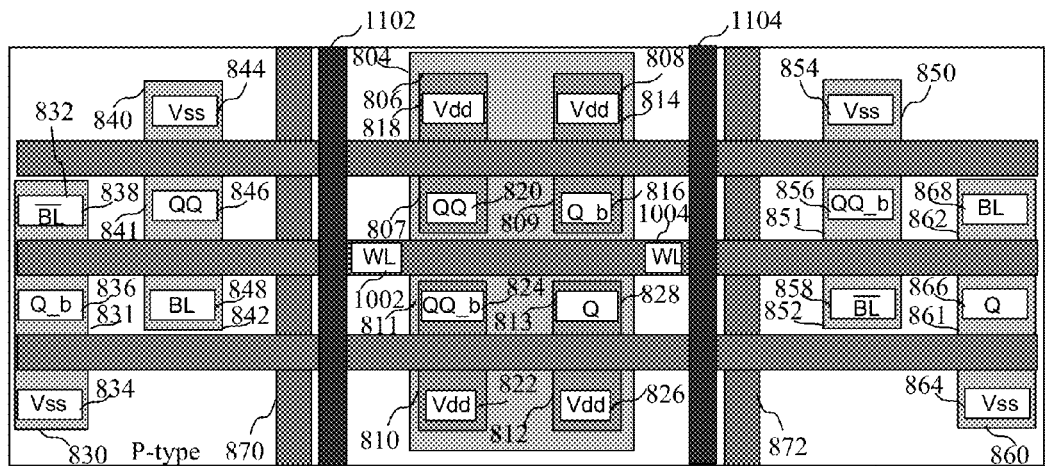
FIG. 12 is a top plan view of the circuit of FIG. 7 according to the arrangement of FIG. 11 and further having a predetermined arrangement of P-type transistors in the N-well.

According to the embodiment of FIG. 12, the arrangement of FIG. 11 is further optimized to provide a predetermined arrangement of P-type transistors in the N-well as shown. By rearranging nodes further, the pair of transistors 720-710 can be separated out more by interchanging positions of transistors 710 and 722, and therefore reduces SER even more. As shown in FIG. 12, the QQ node and QQ_b node are no longer adjacent. While the new arrangement of transistors may be at the expense of area, the arrangement of FIG. 12 will further reduce the likelihood that a radiation strike will affect both redundant nodes Q_b and QQ_b.

Figure 13:
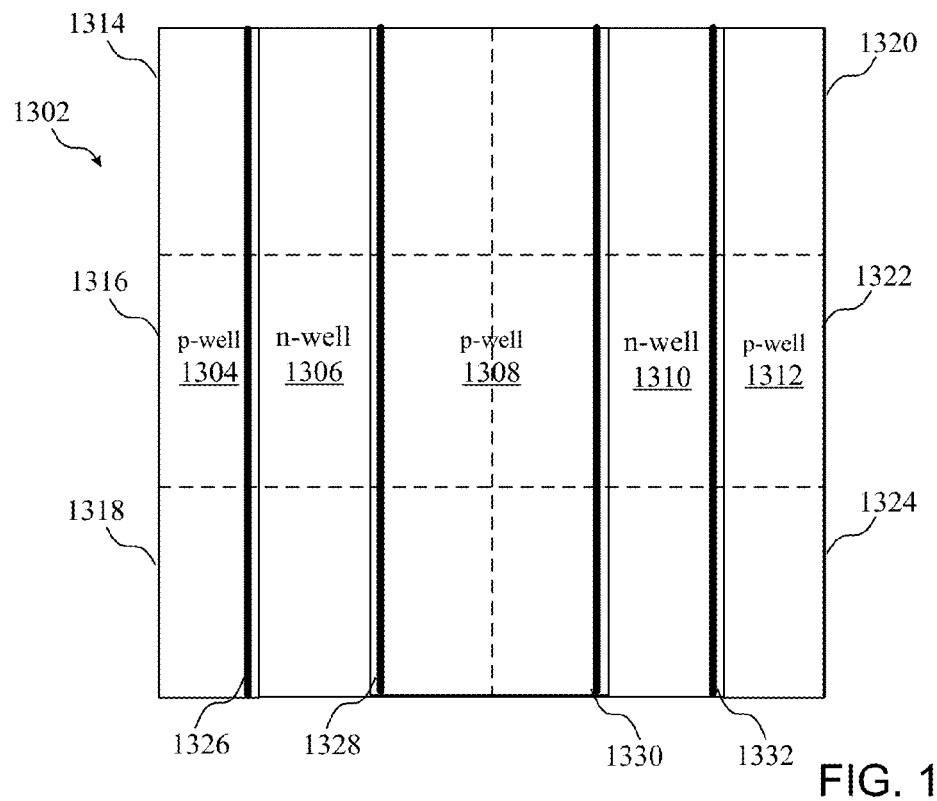
FIG. 13 is a top plan view of the integrated circuit showing p-taps in a memory array.

Turning now to FIG. 13, a top plan view of the integrated circuit showing p-taps in a memory array is shown. The p-taps are formed in strips extending the length of the n-well, where each p-tap is associated with a plurality of memory cells. In particular, a portion 1302 of a memory array comprises p-wells separated by n-wells, including p-wells 1304, 1308, and 1312 separated by n-wells 1306 and 1310 as shown. The portion 1302 of memory array comprises 6 memory cells 1314-1324 designated by the dashed lines. As shown in FIG. 13, p-taps 1326 and 1328 extend along the memory cells 1314-1318, while p-taps 1330 and 1332 extend along memory cells 1320-1324. As further shown in FIG. 13, the p-wells 1304 and 1312 are generally narrower that the p-well 1308 because p-well 1308 is used for memory cells on both sides of the p-well. However, it should be understood that for a wider memory array having many more memory cells, the p-wells 1304 and 1312 would have the same width as p-well 1308.

Figure 14:
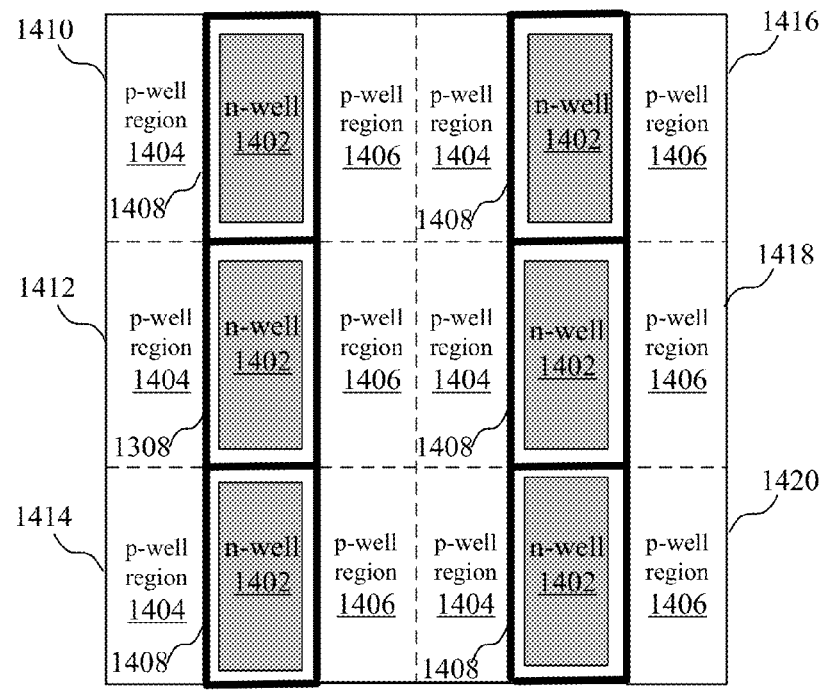
FIG. 14 is a top plan view of the integrated circuit showing p-taps in a memory array according to an alternate arrangement.

Turning now to FIG. 14, a top plan view of the integrated circuit showing p-taps in a memory array according to an alternate arrangement is shown. According to the embodiment of FIG. 14, an n-well 1402 is located between p-well regions 1404 and 1406 and a p-tap 1408 coupled to ground surrounds the n-well 1402. While the embodiment of FIG. 14 shows six memory cells, 1410-1420, it should be understood that many additional cells could be provided on all four sides of the memory array as shown. While n-well 1402 and the p-tap 1408 is formed in the center of the cell, it should be understood that the n-well 1402 and the p-tap 1408 for a given memory cell could be placed in a different location relative to the p-well region having transistors associated with that memory cell.

Turning now to FIG. 15, a cross-sectional view of a memory cell according to an embodiment is shown. The p-epi layer 104 is formed on the p-type wafer 102, as shown in FIG. 15-A. The n-well region 404 and the p-well region 106 are then formed as shown in FIG. 15-B. The source and drain elements 404, 430 and 440 and the P-taps 502 and 506 are then formed, as shown in FIG. 15-C. The contact elements for the source and drain regions and P-taps are then formed, as shown in FIG. 15-D. Metal layers, including a first metal layer forming power trace 456 and contacts and any additional metal layers separated by dielectric layers, are then formed over the substrate.

Turning now to FIG. 16, a block diagram of a system for programming a device having programmable resources according to an embodiment is shown. In particular, a computer 1602 is coupled to receive a circuit design 1604 from a memory 1606, and generate a configuration bitstream which is stored in the non-volatile memory 1606. As will be described in more detail below, the circuit design may be a high level design, such as a circuit design defined in a hardware description language (HDL). Also, the computer may be configured to run software that generates a configuration bitstream which is stored in the non-volatile memory 1608 and provided to an integrated circuit 1610 which may be a programmable integrated circuit, such as the integrated circuit described below in FIG. 17.

Figure 17:
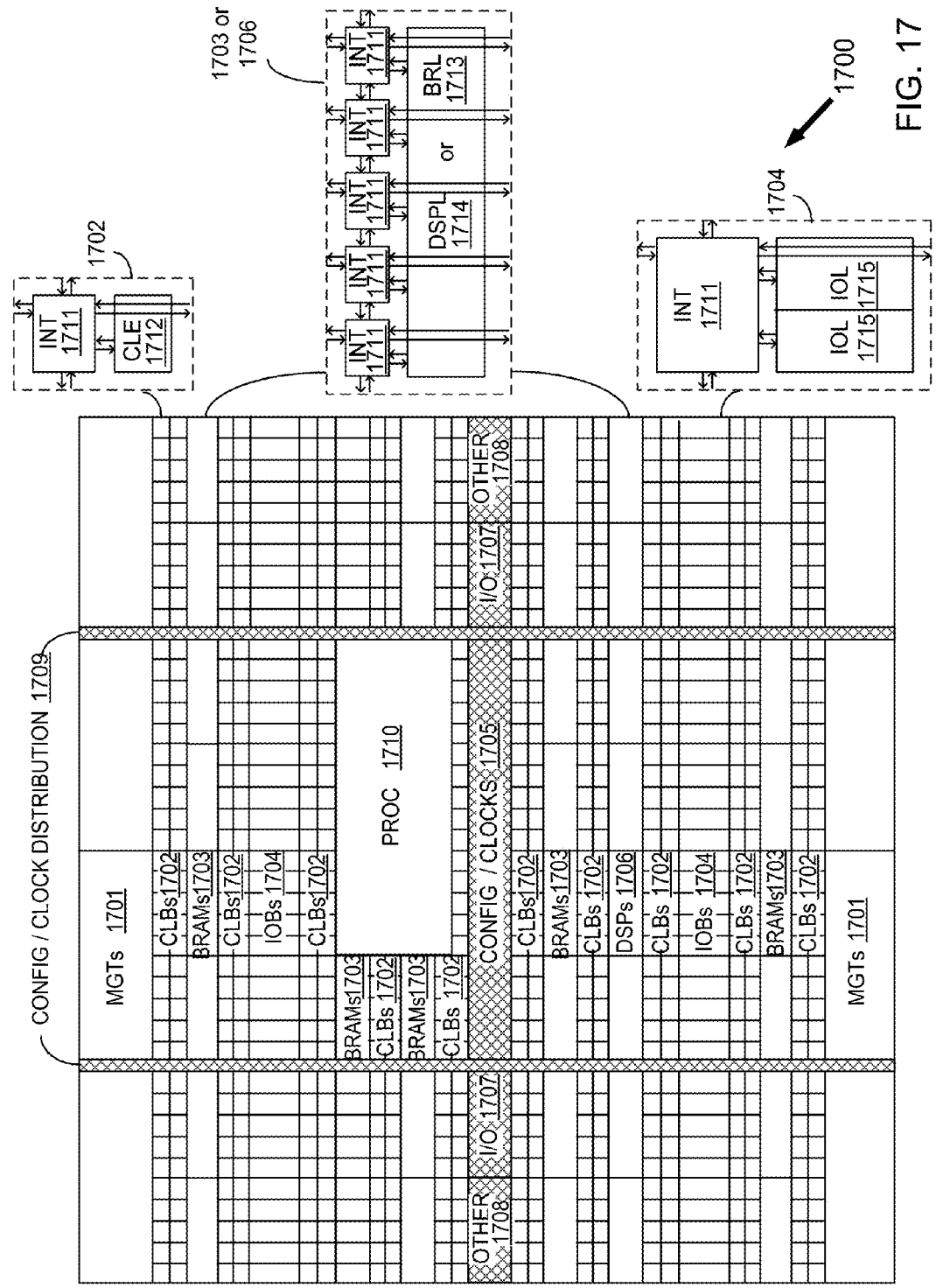
FIG. 17 is a block diagram of a device having programmable resources which may implement the circuits of FIGS. 2-15.

Turning now to FIG. 17, a block diagram of a device having programmable resources including the circuits of FIGS. 2-16 is shown. While devices having programmable resources may be implemented in any type of integrated circuit device, such as an application specific integrated circuit (ASIC) having programmable resources, other devices comprise dedicated programmable logic devices (PLDs). One type of PLD is the Complex Programmable Logic Device (CPLD). A CPLD includes two or more "function blocks" connected together and to input/output (I/O) resources by an interconnect switch matrix. Each function block of the CPLD includes a two-level AND/OR structure similar to that used in a Programmable Logic Array (PLA) or a Programmable Array Logic (PAL)

device. Another type of PLD is a field programmable gate array (FPGA). In a typical FPGA, an array of configurable logic blocks (CLBs) is coupled to programmable input/output blocks (IOBs). The CLBs and IOBs are interconnected by a hierarchy of programmable routing resources. These CLBs, IOBs, and programmable routing resources are customized by loading a configuration bitstream, typically from off-chip memory, into configuration memory cells of the FPGA. For both of these types of programmable logic devices, the functionality of the device is controlled by configuration data bits of a configuration bitstream provided to the device for that purpose. The configuration data bits may be stored in volatile memory (e.g., static memory cells, as in FPGAs and some CPLDs), in non-volatile memory (e.g., Flash memory, as in some CPLDs), or in any other type of memory cell.

The device of FIG. 17 comprises an FPGA architecture 1400 having a large number of different programmable tiles including multi-gigabit transceivers (MGTs) 1701, CLBs 1702, random access memory blocks (BRAMs) 1703, input/output blocks (IOBs) 1704, configuration and clocking logic (CONFIG/CLOCKS) 1705, digital signal processing blocks (DSPs) 1706, specialized input/output blocks (I/O) 1707 (e.g., configuration ports and clock ports), and other programmable logic 1708 such as digital clock managers, analog-to-digital converters, system monitoring logic, and so forth. Some FPGAs also include dedicated processor blocks (PROC) 1710, which may be used to implement a software application, for example.

In some FPGAs, each programmable tile includes a programmable interconnect element (INT) 1711 having standardized connections to and from a corresponding interconnect element in each adjacent tile. Therefore, the programmable interconnect elements taken together implement the programmable interconnect structure for the illustrated FPGA. The programmable interconnect element 1711 also includes the connections to and from the programmable logic element within the same tile, as shown by the examples included at the top of FIG. 17.

For example, a CLB 1702 may include a configurable logic element (CLE) 1712 that may be programmed to implement user logic plus a single programmable interconnect element 1711. A BRAM 1703 may include a BRAM logic element (BRL) 1713 in addition to one or more programmable interconnect elements. The BRAM includes dedicated memory separate from the distributed RAM of a configuration logic block. Typically, the number of interconnect elements included in a tile depends on the height of the tile. In the pictured embodiment, a BRAM tile has the same height as five CLBs, but other numbers may also be used. A DSP tile 1706 may include a DSP logic element (DSPL) 1714 in addition to an appropriate number of programmable interconnect elements. An 10B 1704 may include, for example, two instances of an input/output logic element (IOL) 1715 in addition to one instance of the programmable interconnect element 1711. The location of connections of the device is controlled by configuration data bits of a configuration bitstream provided to the device for that purpose. The programmable interconnects, in response to bits of a configuration bitstream, enable connections comprising interconnect lines to be used to couple the various signals to the circuits implemented in programmable logic, or other circuits such as BRAMs or the processor.

In the pictured embodiment, a columnar area near the center of the die is used for configuration, clock, and other control logic. The config/clock distribution regions 1409 extending from this column are used to distribute the clocks and configuration signals across the breadth of the FPGA. Some FPGAs utilizing the architecture illustrated in FIG. 17 include additional logic blocks that disrupt the regular columnar structure making up a large part of the FPGA. The additional logic blocks may be programmable blocks and/or dedicated logic. For example, the processor block PROC 1710 shown in FIG. 17 spans several columns of CLBs and BRAMs.

Note that FIG. 17 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the top of FIG. 17 are purely exemplary. For example, in an actual FPGA more than one adjacent column of CLBs is typically included wherever the CLBs appear in order to facilitate the efficient implementation of user logic. While the embodiment of FIG. 17 relates to an integrated circuit having programmable resources, it should be understood that the circuits and methods set forth in more detail below could be implemented in any type of ASIC.

Figure 18:
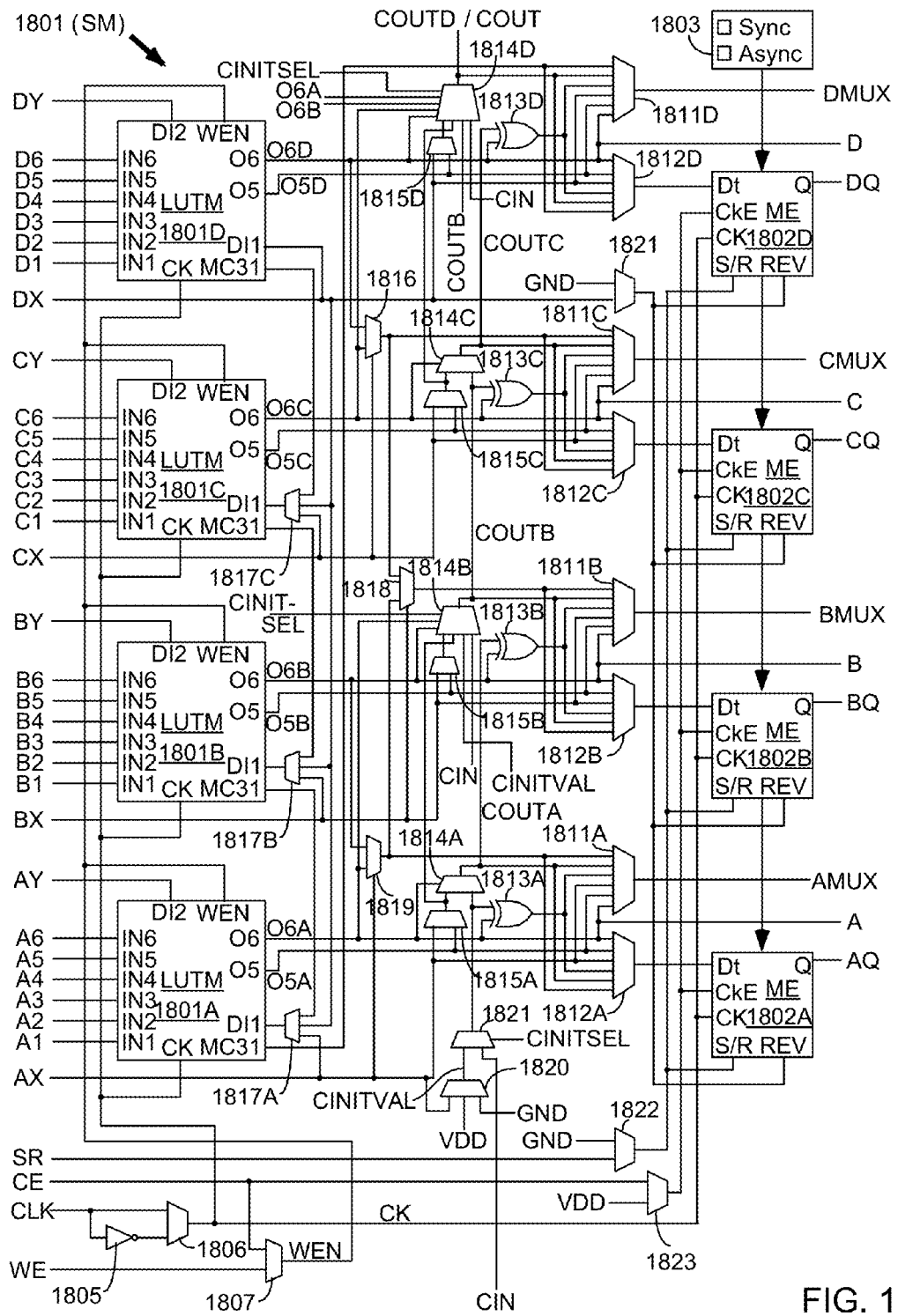
FIG. 18 is a block diagram of a configurable logic element of the device of FIG. 17.

Turning now to FIG. 18, block diagram of a configurable logic element of the device of FIG. 17 is shown. In particular, FIG. 18 illustrates in simplified form a configurable logic element of a configuration logic block 1702 of FIG. 17. In the embodiment of FIG. 18, slice M 1801 includes four lookup tables (LUTMs) 1801A-1801D, each driven by six LUT data input terminals A1-A6, B1-B6, C1-C6, and D1-D6 and each providing two LUT output signals O5 and O6. The O6 output terminals from LUTs 1801A-1801D drive slice output terminals A-D, respectively. The LUT data input signals are supplied by the FPGA interconnect structure via input multiplexers, which may be implemented by programmable interconnect element 1811, and the LUT output signals are also supplied to the interconnect structure. Slice M also includes: output select multiplexers 1811A-1811D driving output terminals AMUX-DMUX; multiplexers 1812A-1812D driving the data input terminals of memory elements 1802A-1802D; combinational multiplexers 1816, 1818, and 1819; bounce multiplexer circuits 1822-1823; a circuit represented by inverter 1805 and multiplexer 1806 (which together provide an optional inversion on the input clock path); and carry logic having multiplexers 1814A-1814D, 1815A-1815D, 1820-1821 and exclusive OR gates 1813A-1813D. All of these elements are coupled together as shown in FIG. 18. Where select inputs are not shown for the multiplexers illustrated in FIG. 18, the select inputs are controlled by configuration memory cells. That is, configuration bits of the configuration bitstream stored in configuration memory cells are coupled to the select inputs of the multiplexers to select the correct inputs to the multiplexers. These configuration memory cells, which are well known, are omitted from FIG. 18 for clarity, as well as from other selected figures herein.

In the pictured embodiment, each memory element 1802A-1802D may be programmed to function as a synchronous or asynchronous flip-flop or latch. The selection between synchronous and asynchronous functionality is made for all four memory elements in a slice by programming Sync/Asynch selection circuit 1803. When a memory element is programmed so that the S/R (set/reset) input signal provides a set function, the REV input terminal provides the reset function. When the memory element is programmed so that the S/R input signal provides a reset function, the REV input terminal provides the set function. Memory elements 1802A-15802D are clocked by a clock signal CK, which may be provided by a global clock network or by the interconnect structure, for example. Such programmable memory elements are well known in the art of FPGA design. Each memory element 1802A-1802D provides a registered output signal AQ-DQ to the interconnect structure. Because each LUT 1801A-1801D provides two output signals, O5 and O6, the LUT may be configured to function as two 5-input LUTs with five shared input signals (IN1-IN5), or as one 6-input LUT having input signals IN1-IN6.

In the embodiment of FIG. 18, each LUTM 1801A-1801D may function in any of several modes. When in lookup table mode, each LUT has six data input signals IN1-IN6 that are supplied by the FPGA interconnect structure via input multiplexers. One of 64 data values is programmably selected from configuration memory cells based on the values of signals IN1-IN6. When in RAM mode, each LUT functions as a single 64-bit RAM or two 32-bit RAMs with shared addressing. The RAM write data is supplied to the 64-bit RAM via input terminal DI1 (via multiplexers 1817A-1817C for LUTs 1801A-1801C), or to the two 32-bit RAMs via input terminals DI1 and DI2. RAM write operations in the LUT RAMs are controlled by clock signal CK from multiplexer 1806 and by write enable signal WEN from multiplexer 1807, which may selectively pass either the clock enable signal CE or the write enable signal WE. In shift register mode, each LUT functions as two 16-bit shift registers, or with the two 16-bit shift registers coupled in series to create a single 32-bit shift register. The shift-in signals are provided via one or both of input terminals DI1 and DI2. The 16-bit and 32-bit shift out signals may be provided through the LUT output terminals, and the 32-bit shift out signal may also be provided more directly via LUT output terminal MC31. The 32-bit shift out signal MC31 of LUT 1801A may also be provided to the general interconnect structure for shift register chaining, via output select multiplexer 1811D and CLE output terminal DMUX. Accordingly, the circuits and methods set forth above may be implemented in a device such as the devices of FIGS. 17 and 18, or any other suitable device.

Figure 19:
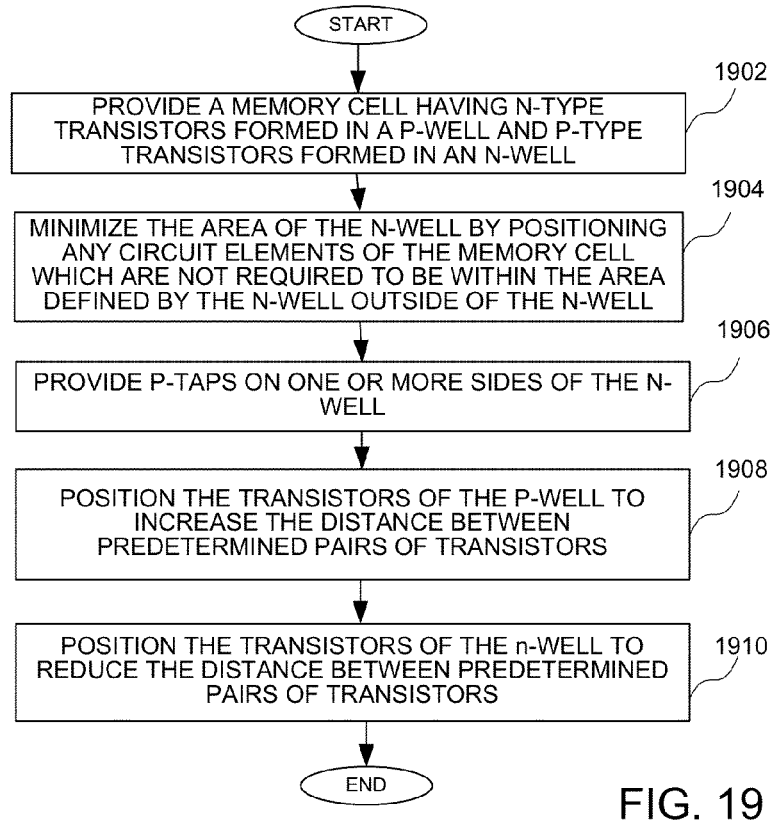
FIG. 19 is a flow chart showing a method of implementing an integrated circuit.

Turning now to FIG. 19, a flow chart shows a method of implementing an integrated circuit. In particular, a memory cell having n-type transistors formed in a P-well and P-type transistors formed is provided in an N-well at a step 1902. The area of the N-well is minimized by positioning any circuit elements of the memory cell which are not required to be within the area defined by the N-well outside of the N-well at a step 1904. P-taps are provided on one or more sides of the N-well at a step 1906. The transistors of the P-well are positioned to increase the distance between predetermined pairs of transistors at a step 1908. The transistors of the N-well are positioned to reduce the distance between predetermined pairs of transistors at a step 1910.

Figure 20:
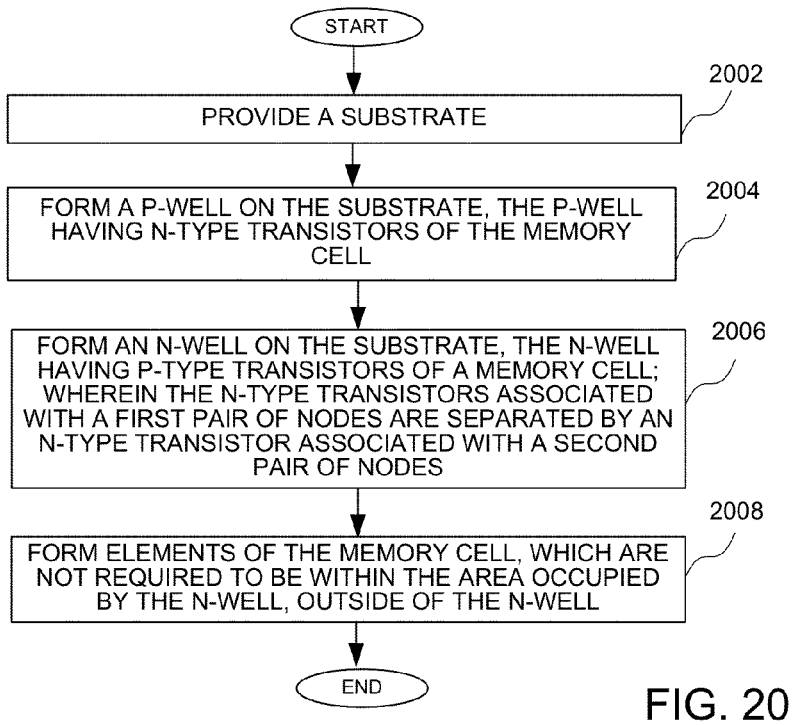
FIG. 20 is a flow chart showing a method of forming an integrated circuit.

Turning now to FIG. 20 is a flow chart shows a method of forming an integrated circuit. In particular, a substrate is provided at a step 2002. A P-well is formed on the substrate, the P-well having N-type transistors of the memory cell at a step 2004. An N-well is also formed on the substrate, the N-well having P-type transistors of a memory cell at a step 2006, wherein the N-type transistors associated with a first pair of nodes are separated by an N-type transistor associated with a second pair of nodes. Elements of the memory cell, which are not required to be within the area occupied by the N-well, are formed outside of the N-well at a step 2008.

It can therefore be appreciated that a new integrated circuit having improved radiation immunity and method of implementing an integrated circuit has been described. It will be appreciated by those skilled in the art that numerous alternatives and equivalents will be seen to exist which incorporate the disclosed invention. As a result, the invention is not to be limited by the foregoing embodiments, but only by the following claims.

We claim:

1. An integrated circuit having improved radiation immunity, the integrated circuit comprising:
   a substrate;
   a P-well formed on the substrate and having N-type transistors of a memory cell; and
   an N-well formed on the substrate and having P-type transistors of the memory cell;
   wherein the integrated circuit further comprising a first P-tap between the N-well and the N-type transistors in the P-well;
   wherein the memory cell is a 12 transistor memory cell; and
   wherein the memory cell has a first pair of nodes and a second pair of nodes, and N-well regions forming an N-type transistor associated with the second pair of nodes are located between P-well regions forming a P-type transistor associated with a node of the first pair of nodes and N-well regions forming an N-type transistor associated with another node of the first pair of nodes.

2. The integrated circuit of claim 1, further comprising a word line contact located outside an area defined by the N-well.

3. The integrated circuit of claim 1, wherein a power trace is located outside an area defined by the N-well.

4. The integrated circuit of claim 1, further comprising a second P-tap on a second side of the N-well opposite the first side of the N-well.

5. The integrated circuit of claim 4, wherein the 12 transistor memory; cell comprise N-type transistors on the first side of the N-well and on the second side of the N-well, the integrated circuit further comprising a first word line contact associated with N-type transistors on the first side of the N-well and a second word line contact associated with N-type transistors on the second side of the N-well.

6. The integrated circuit of claim 4, wherein a power trace is located outside an area occupied by the N-well.

7. An integrated circuit having improved radiation immunity, the integrated circuit comprising:
   a substrate;
   a P-well formed on the substrate and having N-type transistors of a memory cell; and
   an N-well formed on the substrate and having P-type transistors of the memory cell;
   wherein the memory cell has a first pair of nodes and a second pair of nodes, and N-well regions forming an N-type transistor associated with the second pair of nodes are located between P-well regions forming a P-type transistor associated with a node of the first pair of nodes and N-well regions forming an N-type transistor associated with another node of the first pair of nodes.

8. The integrated circuit of claim 7, further comprising a first P-tap on a first side of the N-well and a second P-tap on a second side of the N-well.

9. The integrated circuit of claim 8, wherein the memory cell is a 12 transistor memory cell and comprises N-type transistors on the first side of the N-well and on the second side of the N-well, the integrated circuit further comprising a first word line contact associated with N-type transistors on the first side of the N-well and a second word line contact associated with N-type transistors on the second side of the N-well.

10. The integrated circuit of claim 7, wherein the P-type transistors are positioned within the N-well to increase the distance between the node of the first pair of nodes and the other node of the first pair of nodes.

11. A method of forming an integrated circuit having improved radiation immunity, the method comprising:
  providing a substrate;
  forming a P-well on the substrate, the P-well having N-type transistors of a memory cell; and
  forming an N-well on the substrate, the N-well having P-type transistors of the memory cell;
  wherein the memory cell has a first pair of nodes and a second pair of nodes, and N-well regions forming an N-type transistor associated with the second pair of nodes are located between P-well regions forming a P-type transistor associated with a node of the first pair of nodes and N-well regions forming an N-type transistor associated with another node of the first pair of nodes.

12. The method of claim 11, further comprising a word line contact located outside an area defined by the N-well.

13. The method of claim 11, wherein forming the N-well and the P-well of the memory cell comprises forming a 6 transistor memory cell having a P-tap between the N-well and the N-type transistors in the P-well.

14. The method of claim 11, further comprising forming a power trace outside an area defined by the N-well.

15. The method of claim 11, wherein forming the N-well and P-well of the memory cell comprises forming a 12 transistor memory cell comprising a first P-tap on a first side of the N-well and a second P-tap on a second side of the N-well opposite the first side of the N-well.

16. The method of claim 15, wherein forming the 12 transistor memory cell comprises forming N-type transistors on the first side of the N-well and on the second side of the N-well, and further comprising forming a first word line contact on the first side of the N-well and a second word line contact on the second side of the N-well.

17. The method of claim 15, further comprising forming a power trace that is located outside an area defined by the N-well.

* * * * *